United States Patent [19]

van de Plassche

[11] Patent Number: 4,587,443
[45] Date of Patent: May 6, 1986

[54] AUTO-ZERO SAMPLE AND HOLD CIRCUIT

[75] Inventor: Rudy J. van de Plassche, Cupertino, Calif.

[73] Assignee: Signetics Corporation, Sunnyvale, Calif.

[21] Appl. No.: 644,744

[22] Filed: Aug. 27, 1984

[51] Int. Cl.[4] .............................................. G11C 27/02
[52] U.S. Cl. .................................. 307/353; 307/491; 307/494
[58] Field of Search ............... 307/352, 353, 491, 494, 307/542; 328/151

[56] References Cited

U.S. PATENT DOCUMENTS

| 3,696,305 | 10/1972 | Mitchell et al. | |
|---|---|---|---|
| 4,119,960 | 10/1978 | Hill. | |
| 4,302,689 | 11/1981 | Brodie. | |
| 4,404,479 | 9/1983 | Toyomaki | 307/353 |
| 4,439,693 | 3/1984 | Lucas et al. | 307/353 |

OTHER PUBLICATIONS

F. Gasparik, "An Autozeroing Sample and Hold IC," 1980 IEEE Int'l Solid-State Circs. Conf., Dig. Tech. Paps., Feb. 1980, pp. 132-133.

Primary Examiner—John Zazworsky
Attorney, Agent, or Firm—R. Meetin; R. Mayer; T. Briody

[57] ABSTRACT

A sample and hold circuit contains a pair of differential amplifiers (A1 and A2) switchably arranged in series. The circiut input signal ($V_{IN}$) during sample is provided to the first amplifier (A1) which is coupled to a storage capacitor (C). The second amplifier (A2) provides the circuit output signal ($V_{OUT}$) during hold. Switching circuitry (S1, S2, and S3) enables the input and output signals to undergo the same transfer function in the first amplifier. The voltage offset of the first amplifier is thereby cancelled out of the output signal, while the effect of the voltage offset of the second amplifier is reduced drastically so as to provide excellent auto-zeroing.

6 Claims, 5 Drawing Figures

SAMPLE

HOLD

AUTO-ZERO SAMPLE AND HOLD CIRCUIT

FIELD OF USE

This invention relates to the electronic sample and hold circuits having offset voltage cancellation.

BACKGROUND ART

Circuits that swtich between a sample mode and a hold mode are used widely. During the sample mode, such a sample and hold (S/H) circuit tracks an analog input voltage. During the hold mode, the S/H circuit stores the value of the input voltage that existed just before the circuit switched from sample to hold.

An important objective in designing an S/H circuit is to minimize the offset voltage error in the circuit output signal provided during hold. One way of doing this is to arrange the circuit in such a manner that the total voltage offset occurring during sample is of largely the same magnitude but opposite sign to that occurring during hold so that the offsets cancel. This technique is referred to as auto-zeroing.

U.S. Pat. Nos. 3,696,305, 4,119,960, and 4,302,689 disclose auto-zero S/H circuits. Each of these circuits contains an operational amplifier (hereafter "op amp") whose output voltage slews through at least the value of the analog input voltage when the circuit switches from sample to hold. Becuase the circuit has to settle before a steady-state value is reached for the output voltage, the acquisition time in the hold mode is high.

F. Gasparik, "An Autozeroing Sample and Hold IC," 1980 *IEEE Int'l Solid-State Circs. Conf., Dig., Tech. Paps.*, February 1980, pgs. 132–133, describes an S/H circuit that achieves excellent offset voltage cancellation with less slewing than in the foregoing patents. A disadvantage of the Gasparik circuit is that it has to settle twice during a sample and hold operation. This substantially increases the total acquisition time.

DISCLOSURE OF THE INVENTION

In accordance with the invention, a sample and hold circuit provides an extremely high degree of offset voltage cancellation with nearly zero slewing in transition from sample mode to hold mode. The hold-mode acquisition time is very low. The present auto-zero circuit achieves the advantages of the prior art auto-zero S/H circuits while avoiding their disadvantages.

The present circuit has first and second differential amplifiers, a storage capacitor, and first, second, and third switches. The first amplifier which has non-inverting and inverting outputs amplifies the differential signal between its non-inverting and inverting inputs to produce a differential signal between its outputs. The second amplifier which has a regular (or non-inverting) output amplifies the differential signal between its non-inverting and inverting inputs to produce a signal at its output. A storage capacitor is coupled to the inverting input of the first amplifier.

As used herein, "non-inverting input" and "inverting input" mean the input terminals of a differential amplifying device whose amplified open-loop output signal is substantially in phase with the differential input signal formed by the signal at the non-inverting input relative to the signal at the inverting input. If the output signal is provided differentially from the device, "non-inverting output" and "inverting output" mean the device output terminals between which the differential output signal exists. The open-loop signal at the non-inverting output is substantially in phase with the differential input signal, whereas the open-loop signal at the inverting output is substantially reversed in phase—i.e., opposite in polarity—to the differential input signal. If only a single non-inverting output terminal of the device is utilized for providing the output signal, this terminal is referred to simply as the "output" or "regular output".

During sample, the first switch couples the non-inverting input of the first amplifier to a circuit input terminal for receiving an input signal while the second switch couples the output of the second amplifier to the inverting input of the first amplifier. The third switch couples the non-inverting and inverting outputs of the first amplifier respectively to the non-inverting and inverting inputs of the second amplifier.

During hold, the first switch couples the non-inverting input of the first amplifier to the output of the second amplifier while the second switch couples the output of the second amplifier to a high-impedance position. The third switch reverses the connections of the outputs of the first amplifier so that they are respectively coupled to the inverting and non-inverting inputs of the second amplifier. The circuit output signal is taken at the output of the second amplifier.

Due to the switching, the circuit output signal during hold follows the same path through the first amplifier that the circuit input signal did during sample. The input and output signals thus experience the same offset error in the first amplifier. As a result, the offset of the first amplifier is cancelled out of the output signal, while the effect of the offset of the second amplifier is reduced by a factor proportional to the gain of the first amplifier. If the amplifier gains are very high, the total error between the input and output signals is virtually zero.

For the same reasons, the common-mode rejection ratio is extremely high. The circuit thereby provides high accuracy with fact response.

BRIEF DESCRIPTION OF THE DRAWINGS

Like reference symbols are employed in the drawings and in the description of the preferred embodiments to represent the same or very similar item or items.

DESCRIPTION OF THE PREFERRED EMBODIMENTS

Figure 1:
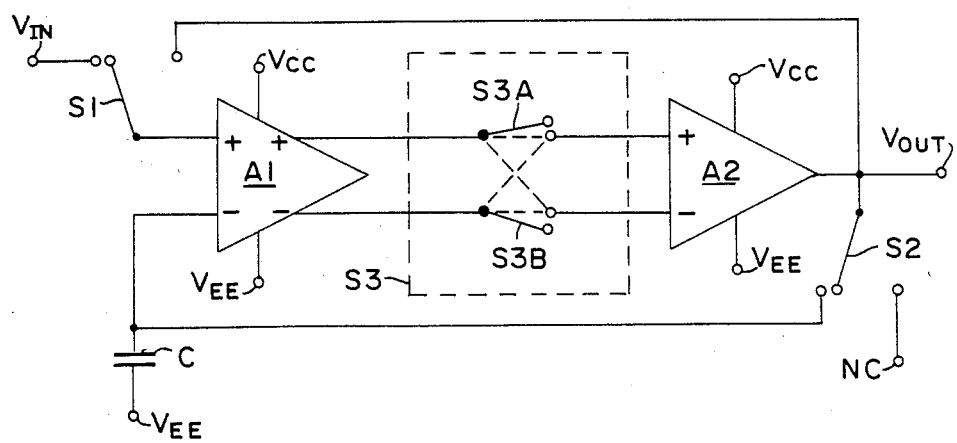
FIG. 1 is a block diagram of an auto-zero S/H circuit in accordance with the invention.
Figure 2A:
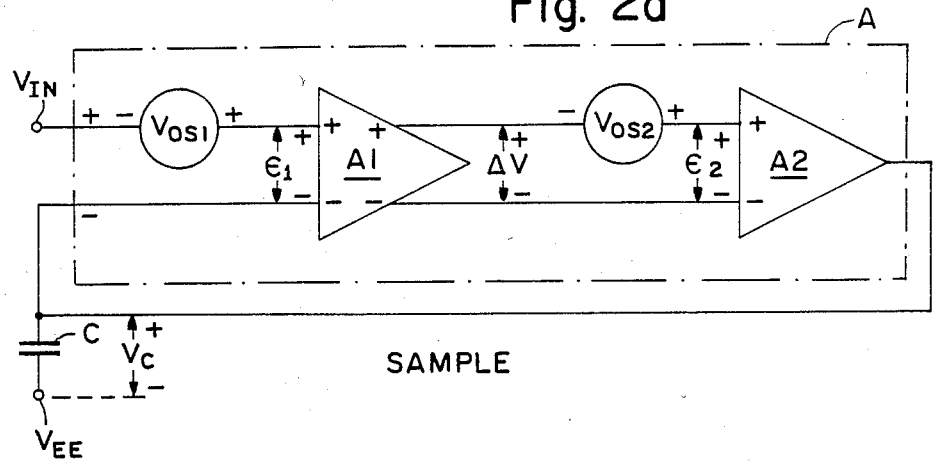
FIGS. 2a and 2b are schematic diagrams of the operational equivalents of the circuit of FIG. 1 during sample and hold, respectively.
Figure 2B:
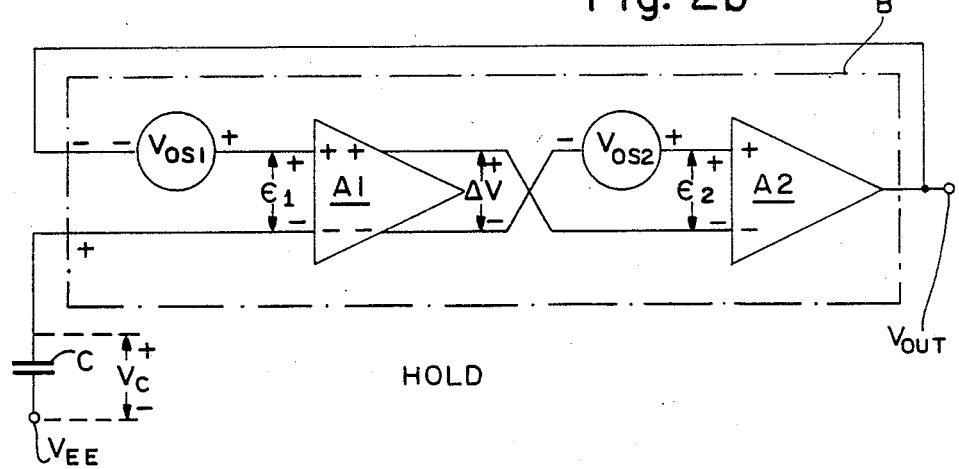

Referring to the drawings, FIG. 1 illustrates an auto-zero S/H circuit that switches between a sample mode during which an input voltage $V_{IN}$ is tracked and a hold mode during which an output voltage $V_{OUT}$ is provided at a value largely equal to the $V_{IN}$ value existing at the end of the sample mode. The voltage offsets occurring in the sample mode for the circuit are substantially cancelled by those occurring in the hold mode. FIG. 2a shows the operational connections when the circuit is in sample. FIG. 2b shows the operational connections for hold.

This auto-zero circuit centers on high-gain differential amplifiers A1 and A2 connected between low and high voltage supplies $V_{EE}$ and $V_{CC}$. Amplifier A1 is a differential output device. It amplifies the differential voltage $\epsilon_1$ between its non-inverting (+) and inverting (−) inputs by a factor $A_1$ to provide an amplified differential voltage $\Delta V$ between its non-inverting (+) and inverting (−) outputs. Amplifier A2 amplifies the differential voltage $\epsilon_2$ between its non-inverting (+) and inverting (−) inputs by a factor $A_2$ to provide its regular output with an amplified signal voltage taken relative to $V_{EE}$.

A storage capacitor C is connected between the A1 inverting input and the $V_{EE}$ supply.

Transition between sample and hold is accomplished with switches S1, S2, and S3. FIG. 1 generally indicates the switch positions for sample. Switch S1 connects the A1 non-inverting input to a circuit input for receiving voltage $V_{IN}$ during sample or to the A2 output during hold. Switch S2 connects the A2 output to the A1 inverting input during sample or to an open-circuit (and therefore high-impedance) position, represented as NC, during hold. Switch S3 consisting of subswitches S3A and S3B connects the non-inverting and inverting outputs of amplifier A1 respectively to the non-inverting and inverting inputs of amplifier A2 during sample. These connections are reversed during hold. That is, switch S3 connects the A1 non-inverting and inverting outputs respectively to the A2 inverting and non-inverting inputs.

Voltage $V_{OUT}$ is the output signal of amplifier A2 during hold. As indicated in FIG. 1, signal $V_{OUT}$ is preferably taken from a terminal connected permanently to the A2 output. Alternatively, signal $V_{OUT}$ could be taken from a terminal connected permanently to the A1 non-inverting input so that the A2 output is connected to the circuit output only during hold.

Turning to FIGS. 2a and 2b for an explanation of circuit operation, the components that form amplifiers A1 and A2 are not ideal. Consequently, each amplifier A1 or A2 has an internal offset voltage that causes its output voltage to be non-zero when its differential input voltage is zero. These offsets are schematically represented by offset voltages $V_{OS1}$ and $V_{OS2}$ at the respective A1 and A2 non-inverting inputs. Offsets $V_{OS1}$ and $V_{OS2}$ could as well be represented at the A1 and A2 inverting inputs. The results are the same with either representation.

During sample, the circuit functions as an op amp in a satble negative-feedback voltage-following configuration. Block A in FIG. 2a represents this op amp. Its non-inverting input receives voltage $V_{IN}$ at the A1 non-inverting input, while its inverting input at the A1 inverting input is connected directly to its output at the A2 output. Gains $A_1$ and $A_2$ are quite high. As a result, capacitor C is charged to a voltage $V_C$ that closely follows voltage $V_{IN}$.

The circuit equations during sample are:

$$\Delta V = A_1 \epsilon_1 = A_1(V_{IN} - V_C + V_{OS1}) \quad (1)$$

$$V_C = A_2 \epsilon_2 = A_2(V_{OS2} + \Delta V) \quad (2)$$

Combining Eqs. (1) and (2) gives:

$$V_{IN} = V_C - V_{OS1} - V_{OS2}/A_1 + V_C/A_1 A_2 \quad (3)$$

When the circuit is switched to hold, capacitor C holds voltage $V_C$ at the value existing just before the circuit switched. The circuit again functions as an op amp in a stable negative-feedback voltage-following configuration. This time, however, the arrangement is basically reversed as indicated by block B in FIG. 2b for the op amp. Its non-inverting input is connected to the A1 inverting input to receive voltage $V_C$. The inverting input of op amp B is connected directly to its output at the A2 output where voltage $V_{OUT}$ is generated and held.

The circuit equations during hold are:

$$\Delta V = A_1 \epsilon_1 = A_1(V_{OUT} - V_C + V_{OS1}) \quad (4)$$

$$V_{OUT} = A_2 \epsilon_2 = A_2(V_{OS2} - \Delta V) \quad (5)$$

As pointed out below, voltages $V_{OUT}$ and $V_{IN}$ are very close to each other. A comparison of Eqs. (1) and (4) which thereby give nearly the same $\Delta V$ indicates that virtually no slewing occurs at the A1 output in switching from sample to hold. The sign of the $\Delta V$ term in Eq. (5) is reversed from that in Eq. (2) because of the inversion of the A2 input connections. As indicated below, this causes voltage $V_{OUT}$ to differ from voltage $V_C$ by a small amount. Very little slewing occurs at the A2 output. This enables the hold-mode acquisition time to be extremely low. Combining Eqs. (4) and (5) gives:

$$V_{OUT} = V_C - V_{OS1} + V_{OS2}/A_1 - V_{OUT}/A_1 A_2 \quad (6)$$

Subtracting Eq. (3) from Eq. (6) yields:

$$V_{OUT} - V_{IN} = 2V_{OS2}/A_1 - (V_{OUT} + V_C)/A_1 A_2 \quad (7)$$

The effect of offset $V_{OS1}$ on signal $V_{OUT}$ is therefore totally cancelled, while the effect of offset $V_{OS2}$ on signal $V_{OUT}$ is reduced by a factor $A_1/2$ which is quite high. What physically happens is that signal $V_{OUT}$ during hold goes through the same A1 transfer function and therefore makes the same errors as signal $V_{IN}$ did during sample.

With respect to the last term in Eq. (7), each of voltages $V_{OUT}$ and $V_C$ is approximately $V_{IN}$. Taking this into account, Eq. (7) becomes:

$$V_{OUT} \approx (1 - 2/A_1 A_2) V_{IN} + 2V_{OS2}/A_1 \quad (8)$$

The parenthetical portion of the first term on the right hand side of Eq. (8) is the normal error factor that occurs in an S/H circuit using two differential amplifiers in series. The normal error is quite small since gains $A_1$ and $A_2$ are each typically on the order of $10^3$. The present S/H circuit thus has output characteristics comparable to those of standard S/H circuits using a serial pair of differential amplifiers, except that offset $V_{OS1}$ has no effect on voltage $V_{OUT}$ and the effect of offset $V_{OS2}$ is drastically reduced.

Figure 3:
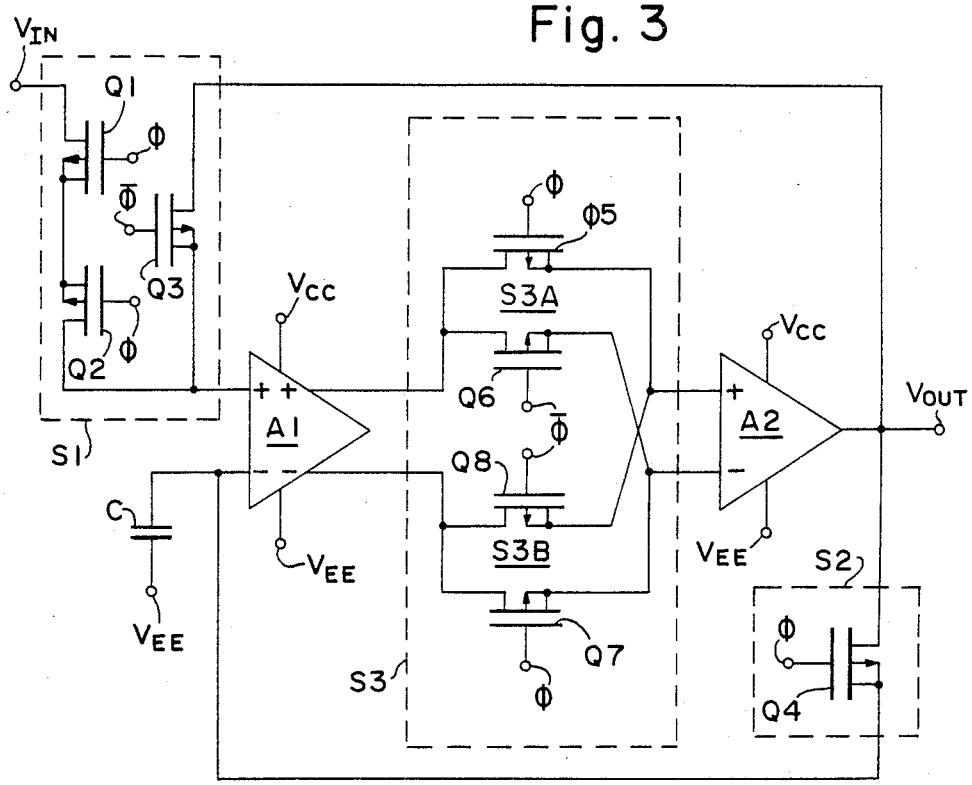
FIGS. 3 and 4 are block and circuit diagrams of more particular embodiments of the circuit of FIG. 1.

FIG. 3 illustrates an embodiment of FIG. 1 in which switches S1–S3 are implemented with N-channel insulated-gate field-effect transistors (FET's) Q1–Q8 arranged as shown in an integrated circuit. Each FET has its own P well. As indicated by the arrows, the well for each FET is connected to its source. The opposite element of each FET is its drain. The gate of each FET responds either to a signal $\phi$ or to a complementary signal $\bar\phi$ as shown. If $\phi$ is high so that $\bar\phi$ is low, the circuit of FIG. 3 is in the sample mode. FET's Q1, Q2, Q4, Q5, and Q7 are turned on, whereas FET's Q3, Q6, and Q8 are turned off. When $\phi$ goes low so that $\bar\phi$ goes high, the circuit switches to hold. The FET conductive conditions are reversed.

Figure 4:
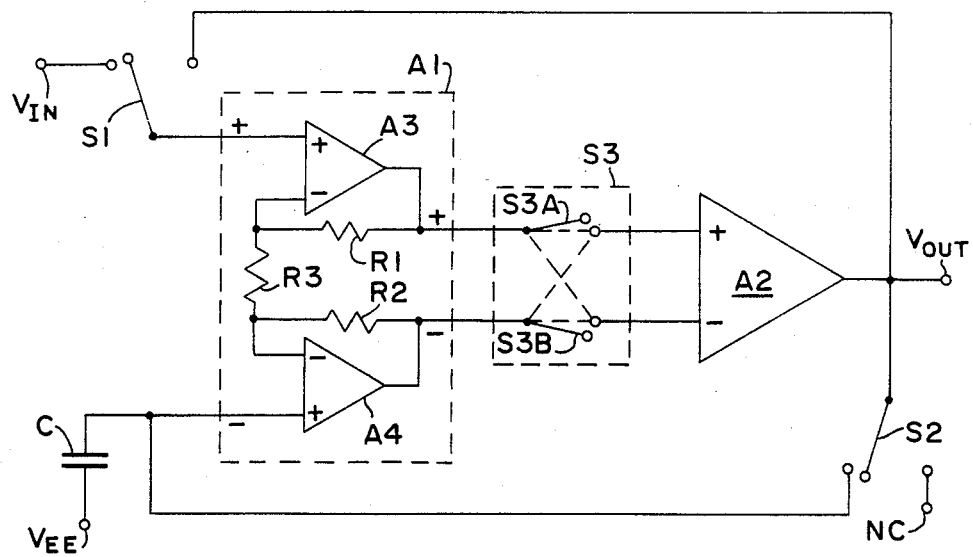

Amplifiers A1 and A2 are typically op amps of conventional type, except that an inverting output signal is taken from amplifier A1. Devices other than simple op amps may, however, be used for amplifiers A1 and A2. FIG. 4 depicts an embodiment of FIG. 1 in which amplifier A1 consists of op amps A3 and A4 and resistors R1, R2, and R3 arranged as shown and operable in a manner known in the analog electronics art.

Methods for manufacturing various elements of the present S/H circuit are well known in the semiconductor art. The circuit is preferably fabricated in monolithic integrated circuit form according to conventional complementary metal-oxide semiconductor techniques.

While the invention has been described with reference to particular embodiments, this description is solely for the purpose of illustration and is not to be construed as limiting the scope of the invention claimed below. For example, semiconductor elements of opposite polarity to those indicated above may be employed to accomplish the same results. The S/H circuit could also be fabricated with bipolar technology using junction FET's in the switches and amplifier input sections. The circuit may be a separate circuit or part of a larger integrated system such as an analog-to-digital converter. Thus, various modifications, changes, and applications may be made by those skilled in the art without departing from the true scope and spirit of the invention as defined by the appended claims.

What is claimed is:

1. A sample and hold circuit comprising:
   first means for amplifying a differential signal between non-inverting and inverting inputs thereof to produce a differential signal between non-inverting and inverting outputs thereof;
   second means for amplifying a differential signal between non-inverting and inverting inputs thereof to produce a signal at an output thereof;
   a storage capacitor coupled to the inverting input of the first means:
   a first switch for selectively coupling the non-inverting input of the first means to a circuit input terminal for receiving an input signal during a sample mode or to the output of the second means during a hold mode;
   a second switch for selectively coupling the output of the second means to the inverting input of the first means during the sample mode or to a high-impedance position during the hold mode; and
   a third switch for selectively coupling the non-inverting and inverting outputs of the first means respectively to the non-inverting and inverting inputs of the second means during the sample mode or respectively to the inverting and non-inverting inputs of the second means during the hold mode.

2. A circuit as in claim 1 wherein the capacitor is particularly connected between a supply voltage point and the inverting input of the first means.

3. A circuit as in claim 1 wherein the signal at the output of the second means is substantially an output signal of the circuit during at least the hold mode.

4. A circuit as in claim 3 wherein the output signal is substantially independent of the voltage offset of the first means.

5. A circuit as in claim 4 wherein $$V_{OUT} \approx (1 - 2/A_1 A_2) V_{IN} + 2 V_{OS2}/A_1$$

where $V_{OUT}$ and $V_{IN}$ are the respective voltages of the output and input signals, $A_1$ and $A_2$ are the respective gains of the first and second means, and $V_{OS2}$ is the voltage offset of the second means.

6. A circuit as in claim 1 wherein each switch comprises at least one field-effect transistor.

* * * * *